(12) United States Patent
Kamei et al.

(10) Patent No.: US 7,056,755 B1
(45) Date of Patent: Jun. 6, 2006

(54) P-TYPE NITRIDE SEMICONDUCTOR AND METHOD OF MANUFACTURING THE SAME

(75) Inventors: Hidenori Kamei, Fukuoka (JP);
Shuichi Shinagawa, Fukuoka (JP);
Hidemi Takeishi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/680,943

(22) Filed: Oct. 10, 2000

(30) Foreign Application Priority Data

| Oct. 15, 1999 | (JP) | ................................ 11-293319 |
| Jul. 13, 2000 | (JP) | ............................. 2000-212356 |

(51) Int. Cl.
*H01L 21/205* (2006.01)

(52) U.S. Cl. .......................... 438/45; 438/509; 438/46; 438/47

(58) Field of Classification Search ................ 438/510, 438/503, 509, 505, 45, 46, 47, 72, FOR 293, 438/FOR 408; 257/E21.1
See application file for complete search history.

(56) References Cited

U.S. PATENT DOCUMENTS

| 5,432,808 A | | 7/1995 | Hatano et al. ................. 372/45 |
| 5,886,367 A | * | 3/1999 | Udagawa ....................... 257/64 |
| 5,891,790 A | * | 4/1999 | Keller et al. ................. 438/508 |
| 5,932,896 A | * | 8/1999 | Sugiura et al. ................ 257/94 |
| 6,020,602 A | * | 2/2000 | Sugawara et al. ........... 257/103 |
| 6,051,847 A | * | 4/2000 | Oku et al. ..................... 257/94 |
| 6,110,757 A | * | 8/2000 | Udagawa ....................... 438/47 |
| 6,117,700 A | * | 9/2000 | Orita et al. |
| 6,153,894 A | * | 11/2000 | Udagawa ....................... 257/96 |
| 6,204,084 B1 | | 3/2001 | Sugiura et al. ................ 438/46 |
| 6,221,684 B1 | * | 4/2001 | Sugawara et al. ............ 438/47 |

FOREIGN PATENT DOCUMENTS

| EP | 0805500 A1 | 11/1997 |
| JP | 06326416 A | 11/1994 |
| JP | 09040490 A | 2/1997 |
| JP | 10135575 A | 5/1998 |
| JP | 10313133 A | 11/1998 |
| JP | 11238692 | 8/1999 |

OTHER PUBLICATIONS

"p-type Conduction in As-Grown Mg-Doped GaN Grown by Metalorganic Chemical Vapor Deposition" by Sugiura et al., Applied Physics Letters, vol. 72, No. 14 (Apr. 6, 1998), pp. 1748-1750.

* cited by examiner

*Primary Examiner*—George Fourson
(74) *Attorney, Agent, or Firm*—McDermott Will & Emery LLP

(57) ABSTRACT

A method for manufacturing p-type nitride semiconductor comprising a semiconductor layer forming process where a low resistivity p-type nitride semiconductor layer is formed on a substrate by introducing the sources of p-type dopant, nitrogen and Group III sources on a substrate held at a temperature of 600° C. or higher and a cooling process for cooling the substrate which is bearing the p-type nitride semiconductor layer. The manufacturing method features in that the hole carrier concentration of the p-type nitride semiconductor layer decreases during the cooling process. A superior quality p-type nitride semiconductor is made available, without needing any annealing treatment after growth, by properly specifying the concentration of atmosphere gas and the cooling time.

16 Claims, 6 Drawing Sheets

P-TYPE NITRIDE SEMICONDUCTOR AND METHOD OF MANUFACTURING THE SAME

FIELD OF THE INVENTION

The present invention relates to a p-type nitride semiconductor, among the gallium nitride-based (Group III–V) semiconductor for use in light emitting devices emitting blue light or other light of short wavelength; more specifically, a p-type nitride semiconductor that does not require annealing treatment after growth. A method for manufacturing the semiconductor is also included in the present invention.

BACKGROUND OF THE INVENTION

Gallium nitride-based (Group III–V) semiconductor, which has a relatively large bandgap, is one of the prospective materials suitable for the short wavelength light emitting devices used in optical information processing units handling the increasing amount of information contents. In such light emitting devices as a diode device or a laser device, a PN junction is the essential structure, where the carriers are recombined at the vicinity of the junction and the light is emitted. As is well known, it is not easy to provide a low resistivity nitride semiconductor because, in the p-type nitride semiconductor doped with magnesium, Mg, or other acceptor, the activation rate the acceptor is significantly lower relative to doner.

The p-type nitride semiconductor exhibits a high resistivity value even when it is restored to room temperature after growth. In order to obtain a low resistivity, it has been a normal practice to apply a post annealing or other thermal treatment on a p-type nitride semiconductor to dissociate the hydrogen of a complex formed of magnesium and hydrogen from magnesium. Research activities are being made to provide a low resistivity p-type nitride semiconductor without applying the post annealing. If it turns out to be successful, it will bring about an advantage also for an improved productivity in such devices.

In the US Patent Publication 5,932,896 (Japanese Patent Laid-open No. 135575/1998), for example, a method for manufacturing a p-type nitride semiconductor without applying the post annealing is disclosed.

The method disclosed in the above Publication uses a Metal-Organic Chemical Vapor Deposition (MOCVD) process to grow a p-type nitride semiconductor on a sapphire substrate; introducing an organic magnesium compound containing such Group III source as trimethylgallium (TMG), such nitrogen source as ammonia ($NH_3$) and p-type dopant on the substrate of 1100° C. using a nitrogen carrier gas containing hydrogen gas at a 0.8%–20% concentration in the capacity percent. In this way, formation of a magnesium-hydrogen complex is blocked and a p-type nitride semiconductor that exhibits a low resistivity during growth stage is provided. It also discloses a cooling process, where the temperature is decreased to 350° C. in an atmosphere of nitrogen gas containing ammonia by approximately 32% in the capacity percent, and then supply of ammonia is suspended, and the temperature is lowered to room temperature.

The above describe conventional method for manufacturing a p-type nitride semiconductor eliminating the post annealing, however, has following problems. Namely, as the inventor of the above described U.S. Pat. No. 5,932,896 and other writer taught in a thesis (Applied Physics Letters, vol. 72, (1998), p. 1748), the activation rate of magnesium significantly deteriorates if the hydrogen concentration increased merely from 2.4% to 3.7% during crystal growth process, which means that a p-type nitride semiconductor is obtainable only when it is grown in a very low hydrogen concentration. What is more, if a p-type nitride semiconductor is grown in a low hydrogen concentration the surface migration turns out to be insufficient, and certain specific atoms are not disposed at respective optimum points on the surface, making it difficult to obtain a good crystal.

SUMMARY OF THE INVENTION

The present invention addresses the above-described problems, and aims to offer a superior quality p-type nitride semiconductor without needing the post annealing treatment.

The method for manufacturing p-type nitride semiconductor comprises a process of forming a low resistivity p-type nitride semiconductor in the growing process, and a cooling process under which the cooling time or the atmosphere is controlled so that the property of low resistivity is maintained within a practical range usable as a p-type semiconductor.

Described concretely, in a method for manufacturing p-type nitride semiconductor of the present invention, p-type dopant source, nitrogen source and Group III source are introduced on a substrate kept at a temperature 600° C. or higher to form a low resistance p-type nitride semiconductor layer on the substrate, and the substrate bearing the p-type nitride semiconductor layer is cooled. During the cooling process, the hole carrier concentration in the p-type nitride semiconductor layer decreases.

By so doing, a low resistance p-type nitride semiconductor layer is formed on a substrate in an atmosphere containing specific amount of hydrogen that suppresses the p-type dopant from being inactivated, and the hole carrier concentration of the p-type nitride semiconductor layer decreases to a level at which the low resistivity property can be maintained. In this way, a p-type nitride semiconductor having a superior crystal quality is made available without needing any post annealing treatment.

In the present method for manufacturing p-type nitride semiconductor, it is preferred that in the cooling process the hole carrier concentration of the p-type nitride semiconductor layer decreases to approximately 0%–95%.

For example, supposing the hole carrier concentration immediately after growth to be approximately $2.0 \times 10^{17}$ $cm^{-3}$, a concentration of approximately $1.0 \times 10^{16}$ $cm^{-3}$ can be maintained even if the hole carrier concentration decreased by 95%. Thus, a p-type nitride semiconductor that practically functions well is provided.

In the present method for manufacturing p-type nitride semiconductor, it is preferred that it contains in the cooling process a procedure for lowering the substrate temperature from the growth temperature to approximately 600° C. within 30 min.

This makes it sure for the hole carrier concentration of a p-type nitride semiconductor layer to maintain the low resistivity property to be sufficient for a practical functioning.

In the present method for manufacturing p-type nitride semiconductor, it is preferred that the atmosphere for semiconductor layer formation contains hydrogen for approximately 5%–70% in capacity percent.

When an organometallic material is used as the source of Group III element or p-type dopant, hydrogen is normally contained in the atmosphere for raising the decomposition efficiency and expediting the surface migration. However, if the hydrogen concentration is beyond 70%, the inactivating effect caused by the hydrogen on acceptor becomes significant. The inactivation of p-type dopant can be surely suppressed when the hydrogen concentration is controlled to be 5%–70% in accordance with the present invention.

In the present method for manufacturing p-type nitride semiconductor, it is preferred that the atmosphere introduced during the cooling process until the substrate temperature reaches approximately 600° C. from the growth temperature contains hydrogen for approximately 0%–50% in capacity percent.

By so doing, the inactivation in a p-type nitride semiconductor due to hydrogen can be suppressed, and the low resistivity property of relatively high hole carrier concentration in a p-type nitride semiconductor layer is well maintained.

In the present method for manufacturing p-type nitride semiconductor, it is preferred that the atmosphere introduced during the cooling process until the substrate temperature reaches approximately 600° C. from the growth temperature contains ammonia, $NH_3$.

By so doing, dissociation of nitrogen from the surface of the grown p-type nitride semiconductor can be suppressed, as a result, deterioration of the surface can be prevented.

In order to implement the earlier-described objective, the present manufacturing method forms a low resistivity p-type nitride semiconductor in the p-type nitride semiconductor layer formation process, and then provides a certain specific contrivance on the cooling process covering a certain specific substrate temperature range, namely, a substrate temperature range approximately 950° C.–700° C., where the inactivation of p-type dopant emerges in the p-type nitride semiconductor layer.

Described concretely, in the present method for manufacturing p-type nitride semiconductor, the p-type nitride semiconductor layer is cooled during the above-described specific substrate temperature range under a certain specific condition where the inactivation of p-type dopant is hard to occur, which specific condition being built up of a combination of the hydrogen concentration in atmosphere and the cooling time.

In the present method for manufacturing p-type nitride semiconductor, the p-type nitride layer is cooled during the above-described specific substrate temperature range under a certain specific condition where the inactivation of p-type dopant is hard to occur, which specific condition being built up of a combination of the hydrogen concentration in atmosphere and the cooling rate.

This makes it possible for a p-type nitride semiconductor to maintain the low resistivity property within a certain range, where it can function as a practical p-type semiconductor.

Further, a p-type nitride semiconductor of the present invention relates to a p-type nitride semiconductor formed on a substrate at a growth temperature of 600° C. or higher, where the hole carrier concentration immediately after the cooling process is approximately 5%–100% of that at the growth temperature.

In a case where the hole carrier concentration is approximately $2.0 \times 10^{17}$ cm$^{-3}$ immediately after the growth, a concentration of approximately $1.0 \times 10^{16}$ cm$^{-3}$ can be provided even if the hole carrier concentration decreased to 5% of that immediately after growth. Thus, it provides a p-type nitride semiconductor that functions well in practical usage.

Other p-type nitride semiconductor of the present invention relates to a p-type nitride semiconductor formed on a substrate one after another at the growth temperature 600° C. or higher, the p-type nitride semiconductor being exposed at the uppermost surface, the hydrogen concentration at the vicinity of upper surface being the same or within approximately 10 times that inside the p-type nitride semiconductor.

In the conventional p-type nitride semiconductor manufactured through the processes accompanied by the post annealing treatment, hydrogen concentration at the vicinity of exposed upper surface is greater by more than 10 times that inside the p-type nitride semiconductor. However, in a p-type nitride semiconductor of the present invention, the hydrogen concentration at the vicinity of the upper surface of p-type nitride semiconductor remains at the same level, or within approximately 10 times, as that inside of the p-type nitride semiconductor. Therefore, in accordance with the present invention, a p-type nitride semiconductor having an improved activation rate with the p-type dopant is provided.

DESCRIPTION OF THE PREFERRED EMBODIMENTS

Embodiments of the present invention are described with reference to the drawings.

Embodiment 1

A first exemplary embodiment of the present invention is described with reference to the drawings.

Figure 1:
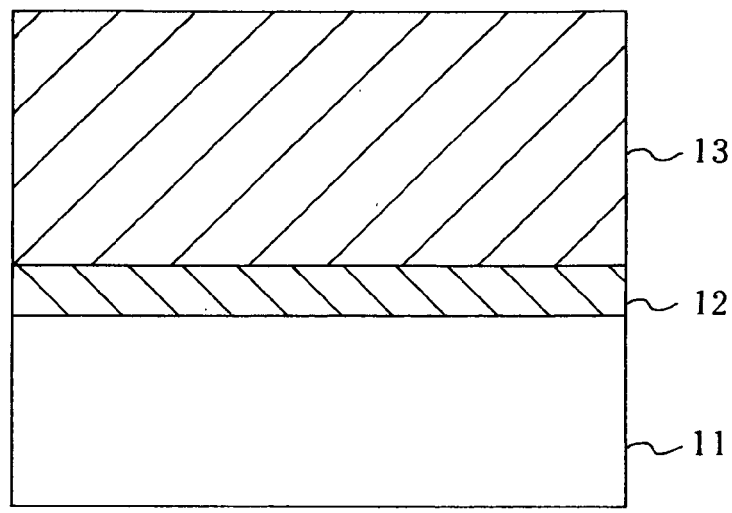
FIG. 1 Cross sectional view showing the structure of a p-type nitride semiconductor in embodiment 1 of the present invention.

FIG. 1 is a cross sectional view showing the structure of a p-type nitride semiconductor in accordance with a first exemplary embodiment of the present invention. On a substrate 11 made of sapphire, a buffer layer 12 formed of gallium nitride (GaN) for easing the lattice mismatch between a certain semiconductor to be grown on the substrate 11 and the sapphire, and a p-type nitride semiconductor layer 13 formed of GaN are stacked in the order.

Method for manufacturing the above p-type nitride semiconductor layer is described in the following. In the first place, the substrate 11 having a mirror-finished main surface is placed in a reaction chamber (not shown) and held by a substrate holder, and then temperature of the substrate 11 is raised to approximately 1000° C., and hydrogen gas is introduced on the substrate 11 while it is heated for approximately 10 min. Stains of organic substance and humidity sticking on the main surface are thus removed.

The substrate temperature is lowered to approximately 550° C., and then nitrogen gas is introduced as carrier gas at a flow rate of approximately 16 Liter/min., and ammonia, $NH_3$, gas as the source of nitrogen at a flow rate of approximately 4 L/min., trimethylgallium (TMG) as the source of Group III at a flow rate of approximately 40 μmol/min. on the substrate 11. The buffer layer 12 of GaN is thus grown on the main surface of substrate 11 for a thickness of 25 nm.

The TMG supply to reaction chamber is once suspended and the substrate temperature is raised to approximately 1050° C.; and a 2 μm thick p-type nitride semiconductor layer 13 of Mg doped GaN is grown on the buffer layer 12, by introducing nitrogen gas at a flow rate of approximately 13 L/min., hydrogen gas at a flow rate of approximately 3 L/min. as carrier gas, and ammonia, $NH_3$, gas at a flow rate of approximately 4 L/min., TMG at a flow rate of approximately 80 μmol/min. and biscyclopentadienymagnesium ($Cp_2Mg$) containing magnesium as p-type dopant at a flow rate of approximately 0.2 μmol/min. on the substrate 11 for approximately 60 min. The above flow rate of hydrogen gas includes the hydrogen gas needed for vaporizing the TMG and the $Cp_2Mg$.

The TMG and $Cp_2Mg$ supplies to the reaction chamber are suspended, and then the substrate 11 is cooled from the growth temperature down to room temperature while nitrogen gas at a flow rate of approximately 13 L/min., hydrogen gas at a flow rate of approximately 3 L/min. and ammonia, $NH_3$, gas at a flow rate of approximately 4 L/min. are being introduced as ambient gas on the substrate 11. After the cooling is finished, the substrate 11 bearing p-type nitride semiconductor layer 13 is taken out of the reaction chamber.

Now in the following, specific features contained in the cooling process of the present invention are described, which cooling process to be applied on the substrate 11 bearing p-type nitride semiconductor layer 13.

Figure 2:
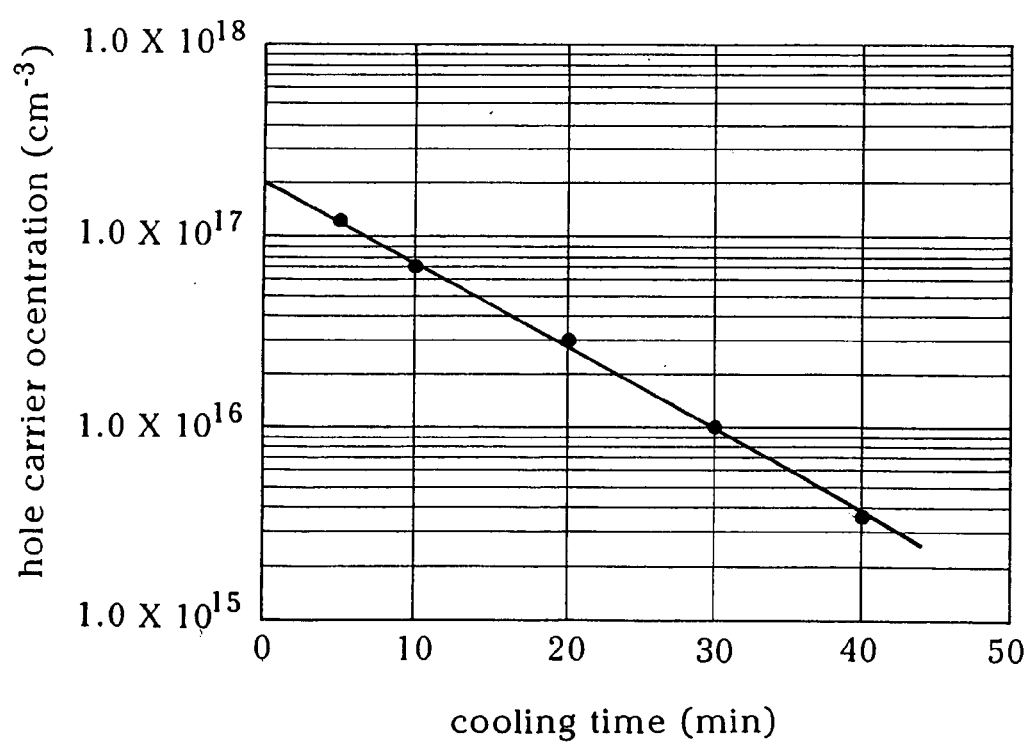
FIG. 2 Graph showing dependence of the hole carrier concentration on the cooling time during cooling process, in a method for manufacturing p-type nitride semiconductor in embodiment 1 of the present invention.

FIG. 2 is a graph showing dependence on the cooling time of the hole carrier concentration during the cooling process in a method for manufacturing p-type nitride semiconductor in the first exemplary embodiment of the present invention. The hole carrier concentration was measured with the p-type nitride semiconductor layers 13 having five different cooling time spans from 5 min. to 40 min. for lowering the substrate temperature from 1050° C., or growth temperature, to 600° C. Measurement of the hole carrier concentration was conducted by measuring the hall effect with a 5 mm square sample chip prepared by separating the substrates 11 provided specifically for the measurement in five different cases.

As seen from FIG. 2, all of the five sample chips exhibit the p-type conduction, and the hole carrier concentration decreases with those having a longer time taken for cooling from the growth temperature to 600° C. By extrapolating the straight line of FIG. 2 to the y piece for the zero cooling time, it may be stated that the p-type nitride semiconductor layer 13 of the present embodiment exhibits a p-type conduction approximately $2 \times 10^{17}$ $cm^{-3}$ with the hole carrier concentration immediately after it is grown.

FIG. 2 also teaches us that: the hole carrier concentration with the 5 min. cooling time is $1.2 \times 10^{17}$ $cm^{-3}$, that with the 20 min. cooling time is $3.0 \times 10^{16}$ $cm^{-3}$, which corresponds to approximately 7% of the concentration before the cooling, and that with the 30 min. cooling time is $1.0 \times 10^{16}$ $cm^{-3}$, which corresponds to approximately 5% of the concentration before the cooling. The case with the 30 min. cooling time is almost at the bottom limit that can be used a p-type layer in a device. In the case with the 40 min. cooling time, the concentration is $2.2 \times 10^{15}$ $cm^{-3}$, indicating that the carrier concentration is insufficient to be used in a device.

First Modification of Embodiment 1

Method for manufacturing p-type nitride semiconductor layer in accordance with a first modification example of embodiment 1 is described below.

First buffer layer 12 and p-type nitride semiconductor layer 13 having the hole carrier concentration of approximately $2 \times 10^{17}$ $cm^{-3}$ are formed in the order on the substrate 11, as shown in FIG. 1, through the same method as in embodiment 1.

Dependence, during the cooling process in the first modification example, of the hole carrier concentration on concentration of hydrogen gas contained in the ambient gas is described below. The hole carrier concentration was measured with those which have undergone four different atmospheres having different hydrogen gas concentration, 0%, 30%, 50% and 70%. Concentration of ammonia, $NH_3$, gas in each of the atmosphere was approximately 20%, and remainder of nitrogen gas. The substrate was cooled from approximately 1050° C., or the growth temperature, to approximately 600° C. in approximately 5 min.

Results of the measurement are:
1) 0% hydrogen concentration approximately $2 \times 10^{17}$ $cm^{-3}$, identical to that immediately after the growth
2) 30% hydrogen concentration $4.2 \times 10^{16}$ $cm^{-3}$,
3) 50% hydrogen concentration approximately $1 \times 10^{16}$ $cm^{-3}$, identical to approximately 5% of that immediately after the growth
4) 70% hydrogen concentration approximately $2.5 \times 10^{15}$ $cm^{-3}$, identical to approximately 1% of that immediately after the growth As seen in the above, when cooled in an ambient of 70% hydrogen concentration, the p-type layer becomes inadequate for use in a device, even if it is cooled to 600° C. in a 5 min. time span.

Second Modification of Embodiment 1

Method for manufacturing p-type nitride semiconductor layer in accordance with a second modification example of embodiment 1 is described below.

First buffer layer 12 and p-type nitride semiconductor layer 13 having the hole carrier concentration of approximately $2 \times 10^{17}$ $cm^{-3}$ are formed in the order on the substrate 11, as shown in FIG. 1, through the same method as in embodiment 1.

Dependence, during the cooling process in the second modification example, of the hole carrier concentration on concentration of ammonia, $NH_3$, gas contained in the atmosphere is described. Concentration of hydrogen gas in the atmosphere was approximately 15%, and remainder of nitrogen gas. The substrate was cooled from approximately 1050° C., or the growth temperature, to approximately 600° C. in approximately 5 min.

As a result of the measurement, it has been confirmed that there is hardly any difference in the rate of decrease during the cooling process in the hole carrier concentration even when concentration of the ammonia, $NH_3$, gas was varied; it stays at a level corresponding that of 20% ammonia, $NH_3$, gas concentration. When the ammonia, $NH_3$, gas concentration is within a range 0%–0.5%, the crystal property deteriorates due to dessociation of nitrogen from the surface of p-type nitride semiconductor layer 13.

Third Modification of Embodiment 1

Method for manufacturing p-type nitride semiconductor layer in accordance with a third modification example of embodiment 1 is described below. In the present modification example, dependence of the hole carrier concentration, during formation of the p-type nitride semiconductor layer 13 shown in FIG. 1, on concentration of hydrogen gas in the carrier gas is described. In embodiment 1, concentration of hydrogen gas in the carrier gas was approximately 15%; while, in the present modification example, concentration of the hydrogen gas in carrier gas was varied in five steps at a 5% interval from 0% to 20%, in six steps at a 10% interval from 20% to 80%, so, eleven steps in all. In the case of 0% hydrogen gas concentration, TMG and $Cp_2Mg$ were vaporized respectively using nitrogen gas.

Result of the measurements on each of the p-type nitride semiconductor layers 13 grown in an atmosphere where the hydrogen gas concentration falls within a range 5%–70% indicated that the hole carrier concentration immediately after the growth was $1 \times 10^{16}$ cm$^{-3}$ or more, meaning that they have the p-type property; the value was obtained like what was shown in FIG. 2 by extrapolating the zero cooling time. More concretely, the hole carrier concentration was approximately $5 \times 10^{16}$ cm$^{-3}$ or more with the hydrogen gas concentration approximately 5%–50%, approximately $1 \times 10^{17}$ cm$^{-3}$ or more with the hydrogen gas concentration approximately 10%–20%. When it is grown in a 15% hydrogen gas concentration, among other cases, the hole carrier concentration immediately after the growth exhibits its peak value, as high as $2 \times 10^{17}$ cm$^{-3}$.

With respect to the full line-width at half the maximum of rocking curve in X-ray diffraction, which represents a criteria for evaluating the crystal property, it goes smaller along with the increasing concentration of hydrogen gas; the full line-width at half the maximum value is less than 300 sec. when concentration of the hydrogen gas is 10% or higher. However, when it is grown in an atmosphere of zero hydrogen gas concentration, the full line-width at half the maximum of rocking curve in X-ray diffraction becomes 500 sec. to a substantially deteriorated crystal property. Furthermore, the high resistivity makes it impossible to measure the hole carrier concentration.

In the same token, when it is grown in an atmospere of approximately 80% hydrogen gas concentration, the high resistivity makes it impossible to measure the hole carrier concentration. The reason for that is supposedly in an increased quantity of hydrogen atom taken during the growth process into the GaN crystal, which lowers the rate of activation with the magnesium.

Although ammonia, $NH_3$, has been used in the present embodiment as nitrogen source, other organic nitride materials such as hydrazine, $N_2H_4$, ethylazide, $C_2H_5NH_2$, may also be used for the purpose.

Embodiment 2

A second exemplary embodiment of the present invention is described with reference to the drawings.

Figure 3:
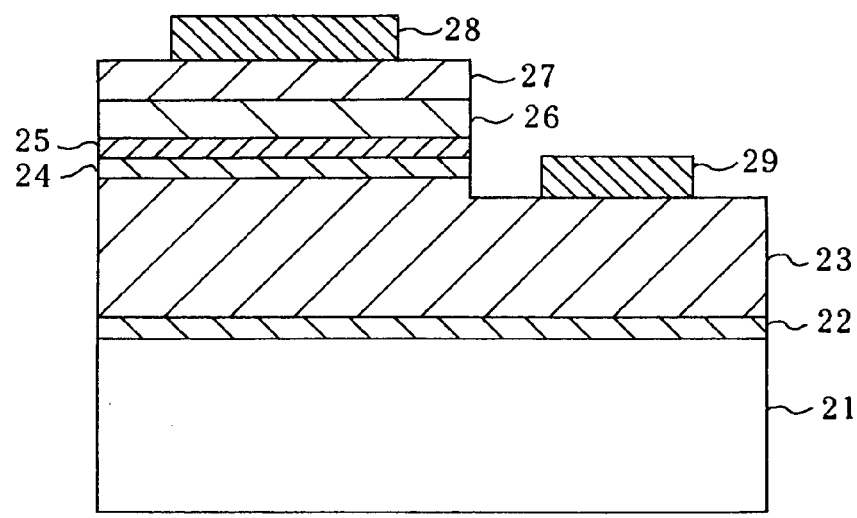
FIG. 3 Cross sectional view showing a structure of p-type nitride semiconductor in embodiment 2 of the present invention.

FIG. 3 is a cross sectional view showing the structure of a nitride semiconductor light emitting device in accordance with a second exemplary embodiment of the present invention. The epitaxial layer of a nitride semiconductor light emitting device in the second embodiment comprises a buffer layer 22 of non-doped GaN disposed on a sapphire substrate 21, an n-type contact layer 23 of Si-doped GaN, a light emitting layer 24 of non-doped InGaN, a first clad layer 25 of non-doped GaN, a p-type second clad layer 26 of Mg-doped AlGaN, and a p-type contact layer 27 of Mg-doped GaN, stacked in the order. On the p-type contact layer 27 is a light-transmitting positive-side electrode 28, which is formed of Ni and Au layers stacked thereon in the order. A negative-side electrode 29 of Al is formed on the exposed region of the n-type contact layer 23. Thus the present light-emitting device is a light-emitting diode having a PN junction of the n-type contact layer 23 and the second clad layer 26, with the non-doped light-emitting layer 24 and the first clad layer 25 interposed in between.

Method for manufacturing the light emitting diode of the above structure is described in the following.

In the first place, a substrate 21 having a mirror-finished main surface is placed in a reaction chamber (not shown) and held by a substrate holder, and then temperature of the substrate 21 is raised to approximately 1000° C., and hydrogen gas is introduced on the substrate 21 while it is heated for approximately 10 min. Stains of organic substance and humidity sticking on the main surface are thus removed, and a clean surface is provided.

The substrate temperature is lowered to approximately 550° C., and then nitrogen gas is introduced as carrier gas at a flow rate of approximately 16 L/min., ammonia, $NH_3$, gas as the source of nitrogen at a flow rate of approximately 4 L/min., and TMG as the source of Group III at a flow rate of approximately 40 µmol/min. on the substrate 21; the buffer layer 22 is thus formed with GaN on the main surface of substrate 21 for a thickness of 25 nm. The flow rate of the hydrogen gas in the carrier gas includes the hydrogen gas needed for vaporizing the TMG or the $Cp_2Mg$.

The TMG supply to reaction chamber is once suspended and the substrate temperature is raised to approximately 1050° C., and a 2 µm thick n-type contact layer 23 of Si doped GaN is grown on the buffer layer 22, by introducing nitrogen gas at a flow rate approximately 13 L/min., hydrogen gas at a flow rate of approximately 3 L/min. as carrier gas, and ammonia, $NH_3$, gas at a flow rate of approximately 4 L/min., TMG at a flow rate of approximately 80 µmol/min. and 10 ppm monosilane, $SiH_4$, containing silicon, an n-type dopant, at a flow rate of approximately 10 cc/min. on the substrate 21 for approximately 60 min.

The TMG and $SiH_4$, gas supplies are suspended, and then the substrate temperature is lowered to approximately 750° C. At this growth temperature, an SQW light emitting layer 24 of 3 nm thick InGaN is grown on the n-type contact layer 23, by introducing nitrogen gas as the carrier gas at a flow rate of approximately 14 L/min., ammonia, $NH_3$, gas at a flow rate of approximately 6 L/min., TMG at a flow rate approximately 4 µmol/min. and trimethylindium (TMI), other source of Group III, at a flow rate of approximately 5 µmol/min. on the substrate 21. The In composition in the light emitting layer 24 of the present case is approximately 0. 2.

Supply of the TMI is suspended, while the nitrogen carrier gas, the ammonia, $NH_3$, gas as the nitrogen source and the TMG as the source of Group III are kept on flowing at the same flow rate respectively on the substrate 21. In this way, a first clad layer 25 of GaN is grown on the light emitting layer 24 for a thickness of 10 nm in the course of the temperature increase in the substrate to approximately 1050° C.

After the substrate temperature reaching at approximately 1050° C., nitrogen gas at a flow rate of approximately 13 L/min., hydrogen gas at a flow rate of approximately 3 L/min. are introduced as carrier gas, and ammonia, $NH_3$, gas at a flow rate of approximately 4 L/min., TMG at a flow rate of approximately 40 µmol/min., trimethylaluminum (TMA) as other source of Group III at a flow rate of approximately 6 µmol/min. and $Cp_2Mg$ at a flow rate of approximately 0. 1 µmol/min. on the substrate 21 for growing a second clad layer 26 of Mg doped p-type AlGaN on the first clad layer 25 for a thickness of 0. 2 µm.

After suspending the TMA supply, and keeping the substrate temperature at approximately 1050° C., nitrogen gas at a flow rate of approximately 13 L/min., hydrogen gas at a flow rate of approximately 3 L/min. are introduced as the carrier gas, and ammonia, $NH_3$, gas at a flow rate of approximately 4 L/min., TMG at a flow rate of approximately 80 µmol/min. and $Cp_2Mg$ at a flow rate of approximately 0. 2 µmol/min. on the substrate 21 for growing a p-type contact layer of Mg doped p-type GaN on the second clad layer 26 for a thickness of 0. 3 µm.

After the p-type contact layer 27 is formed, substrate temperature is lowered from the growth temperature to room temperature while introducing nitrogen gas at a flow rate of approximately 13 L/min., hydrogen gas at a flow rate of approximately 3 L/min. and ammonia, $NH_3$, gas at a flow rate of approximately 4 L/min. in the reaction chamber as ambient gas. The substrate 21 bearing an epitaxial layer formed of a plurality of nitride semiconductor layers is taken out of the reaction chamber. In the ambient gas, the hydrogen gas concentration is approximately 15%, the ammonia, $NH_3$, gas concentration is approximately 20%. The substrate 21 was cooled from the growth temperature, approximately 1050° C., to 600° C. in 5 min.

The nitride semiconductor layers, the p-type second clad layer 26 and the p-type contact layer 27, among others, thus provided have been formed by the same growth process and the cooling method as in embodiment 1. Therefore, superior p-type semiconductor layers of low resistivity have been provided, without undergoing the post annealing treatment needed for activating the Mg doped in the second clad layer 26 and the p-type contact layer.

Next, by using a CVD process, for example, a silicon oxide layer is formed on the p-type contact layer 27 by deposition, a certain specific pattern is provided by a photolithography to form an etching mask, and then the epitaxial layer is etched through a reactive ion etching process using the mask until the n-type contact layer 23 is exposed.

An n-side electrode 29 is formed selectively on the exposed surface of n-type contact layer 23 using, for example, an evaporation process; in the same way, a p-side electrode 28 is formed selectively on the p-type contact layer 27.

The bottom surface, or the surface opposite to the epitaxial layer, of substrate 21 is ground to make thickness of the substrate 21 approximately 100 µm, and the substrate is separated into chips by scribing. Each of the separated chips is fixed on a stem having electrodes thereon with the device-bearing surface up. The p-side electrode 28 and the n-side electrode 29 of the chip are connected with respective electrodes of the stem, and then the entire chip is molded with a resin to become a finished light emitting diode.

It has been confirmed that the light emitting diode provided through the above described procedure emits blue light of 470 nm peak wavelength when driven by a 20 mA forward current. The light output was 2. 0 mW, forward operation voltage was 4. 0 V.

First Modification of Embodiment 2

A light emitting diode having the structure of FIG. 3 was provided by modifying the cooling time of embodiment 2 to 25 min., where temperature of the substrate 21 bearing epitaxial layer is lowered from the growth temperature, approximately 1050° C. to 600° C. The above light emitting diode emitted blue light of 470 nm peak wavelength when driven by a 20 mA forward current. The light output was 0. 5 mW, forward operation voltage was 5. 0 V.

Comparative Example

A light emitting diode having the structure of FIG. 3 was provided by modifying the cooling time of embodiment 2 to 40 min., where temperature of the substrate 21 bearing epitaxial layer is lowered from the growth temperature, approximately 1050° C., to 600° C. The above light emitting diode was driven by a 20 mA forward current, but the electric current did not flow because of high resistance, hence no light was emitted.

Figure 4:
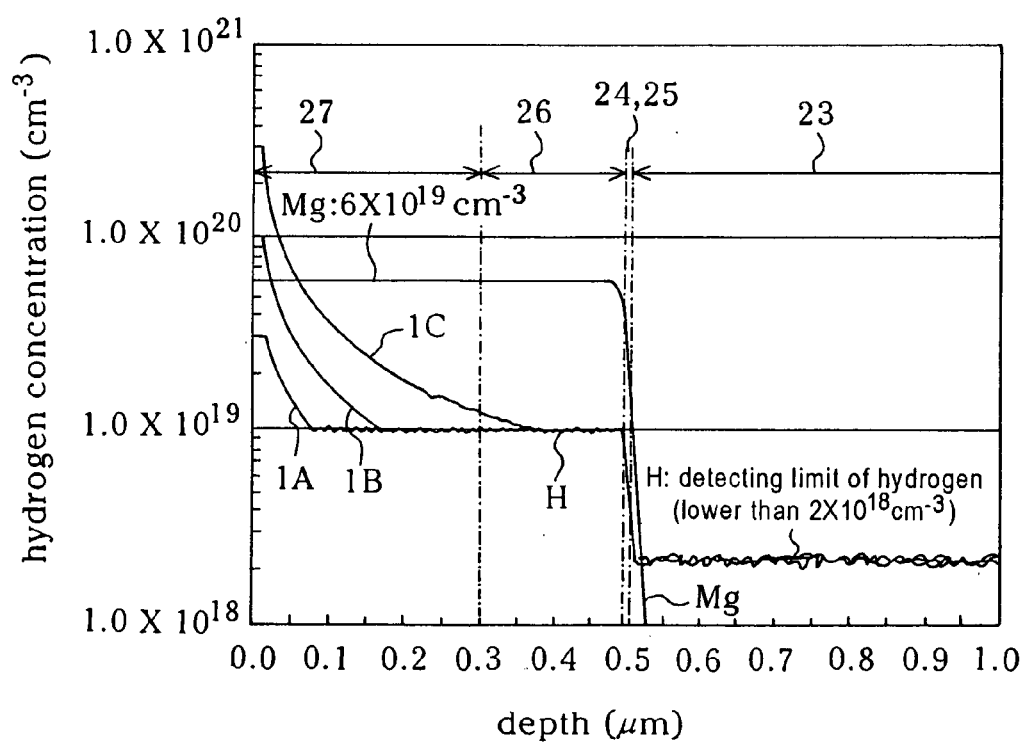
FIG. 4 Graph showing the distribution in depth direction of the hydrogen concentration, with nitride semiconductor light emitting devices in embodiment 2, including a first modification and a comparative sample, of the present invention.

FIG. 4 is a graph showing the hydrogen distribution in the direction of depth from the surface with nitride semiconductor light emitting devices in embodiment 2, in the first modification of embodiment 2 and the comparative example, measured through SIMS (secondary ion mass spectroscopy). The hydrogen concentration is exhibited with respect to the above-described three different time spans provided for the cooling. In FIG. 4, the regions corresponding to semiconductor layers of FIG. 3 are identified by providing the same marks, respectively. Curve 1A represents the case of embodiment 2, where the cooling time from the growth temperature of approximately 1050° C. to 600° C. is 5 min., curve 1B represents the case of the modification where it is 25 min. and curve 1C represents the case of the comparative example where it is 40 min.

Curve 1A in FIG. 4, representing the cooling time 5 min., indicates that the hydrogen concentration is approximately $3.0 \times 10^{19}$ cm$^{-3}$ at a point close to the surface, which concentration decreases along with proceeding towards the substrate (the direction towards the n-type contact layer 23), and in the second clad layer 26 the hydrogen concentration becomes almost constant at approximately $1.0 \times 10^{19}$ cm$^{-3}$. In the first clad layer 25, the light emitting layer 24 and the n-type contact layer 23, it is lower than $2.0 \times 10^{18}$ cm$^{-3}$, which is the lower limit of detection.

Curve 1B of the first modification, representing the cooling time 25 min., indicates that the hydrogen concentration is approximately $1.0 \times 10^{20}$ cm$^{-3}$ at a point close to the surface, which concentration decreases along with proceeding towards the substrate, and in the second clad: layer 26 the hydrogen concentration is almost constant at approximately $1 \times 10^{18}$ cm$^{-3}$.

Curve 1C of the comparative example, representing the cooling time 40 min., indicates that the hydrogen concentration is approximately $3.0 \times 10^{20}$ cm$^{-3}$ at a point close to the surface, which concentration decreases along with proceeding towards the substrate, and in the second clad layer 26 the hydrogen concentration is almost constant at approximately $1 \times 10^{19}$ cm$^{-3}$.

FIG. 4 also indicates that in the case where the cooling time is shorter than 25 min., the hydrogen concentration at the upper surface of p-type contact layer 27 is within 10 times that in the second clad layer 26.

As the above embodiment 2 and its first modification indicate, a superior p-type semiconductor layer provided with a low resistivity immediately after the growth is made available by having the carrier gas used during growth of the p-type second clad layer 26 and the p-type contact layer 27 to contain hydrogen gas for approximately 5% to 70% in capacity percent, preferably approximately 15% in capacity percent.

Furthermore, the decreasing rate in the hole carrier concentration of the p-type semiconductor layer can be suppressed to approximately 0%–95%, by setting the cooling time in the cooling process, where it is cooled from the growth temperature higher than 600° C. to approximately 600° C., to be shorter than approximately 30 min, preferably approximately 5 min., and by forming the atmosphere gas with hydrogen gas of approximately 50% or less in capacity percent and ammonia, NH$_3$, gas of approximately 0. 5% or more in capacity percent. As the result, a nitride semiconductor light emitting device with low forward operation voltage and high output is implemented.

Embodiment 3

FIG. 1 is a cross sectional view showing the structure of a p-type nitride semiconductor in accordance with a third exemplary embodiment of the present invention. On a substrate 11 made of sapphire, a buffer layer 12 formed of GaN and a p-type nitride semiconductor layer 13 formed of GaN are stacked in the order.

In practice, the substrate 11 is placed in a reaction chamber (not shown) and held by a substrate holder, and then temperature of the substrate 11 is raised to approximately 1000° C., and the surface of substrate 11 is cleaned by introducing flow of nitrogen gas and hydrogen gas.

The substrate temperature is lowered to approximately 550° C., and then nitrogen gas is introduced as carrier gas, and ammonia, NH$_3$, and trimethylgallium (TMG) are supplied to form a buffer layer 12 on the surface of substrate 11.

The TMG supply to reaction chamber is once suspended and the substrate temperature is raised to approximately 1050° C., and a p-type nitride semiconductor layer 13 of GaN doped with Mg, which being p-type dopant, is grown on the buffer layer 12, by supplying ammonia, NH$_3$, TMG and biscyclopentadienymagnesium (Cp$_2$Mg), while introducing nitrogen gas and hydrogen gas as the carrier gas.

The TMG and Cp$_2$Mg supplies to the reaction chamber are suspended, and then the substrate 11 is cooled from 1050° C. to 700° C., maintaining the ambient flow of nitrogen gas, hydrogen gas and ammonia, NH$_3$, gas. Thereafter, the supply of hydrogen gas and ammonia, NH$_3$, is suspended, and the substrate 11 is cooled down below 100° C., maintaining the flow of nitrogen gas as the ambient gas.

The method for manufacturing p-type nitride semiconductor in embodiment 3 features in that the p-type nitride semiconductor layer is cooled in the cooling process during approximately 950° C.–approximately 700° C. in substrate temperature under a combination of the hydrogen concentration in the atmosphere and the cooling time, with which the inactivation is hard to occur with the p-type dopant. Further description on this respect follows.

Regarding the cooling process to be applied to a p-type nitride semiconductor after it is formed at a substrate temperature approximately 950° C. or higher, inventors of the present invention found out a fact that the hole carrier concentration in the p-type nitride semiconductor is decreased specifically during a temperature range approximately 950° C.–approximately 700° C. in terms of substrate temperature, by hydrogen existing in the ambient.

Figure 5:
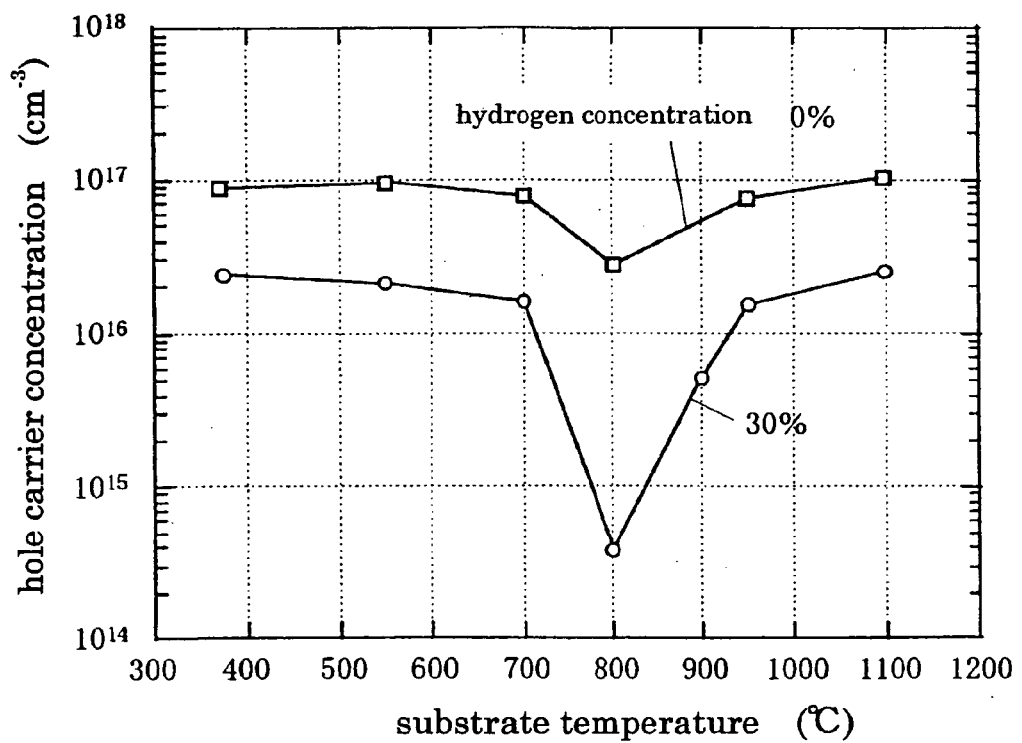
FIG. 5 Graph showing dependence of the hole carrier concentration on the temperature of holding the substrate, during the cooling process in a method for manufacturing p-type nitride semiconductor in an embodiment of the present invention.

FIG. 5 is a graph showing the dependence of the hole carrier concentration in embodiment 3 on the substrate holding temperature during the cooling process. Namely, the respective temperatures shown in the graph represent a temperature at which a substrate, which bears Mg doped GaN layer formed at a substrate temperature 1050° C., is held during the cooling process for 10 min. before it is cooled to room temperature; the horizontal axis represents the substrate temperature at which it is held for 10 min., while the hole carrier concentration is plotted on the vertical axis. The atmosphere for the cooling process was prepared with a 20% concentration of ammonia, NH$_3$, in nitrogen base, in two versions of different hydrogen concentrations, 30% and 0%. As shown in FIG. 5, in the case of 30% hydrogen concentration, the hole carrier concentration significantly decreased in the temperatures between 950° C.–700° C., with the lowest at approximately 800° C. The case of 0% hydrogen concentration also exhibited similar trends in the same temperatures, but amount of the decrease was smaller. Namely, it has been clarified that the hole carrier concentration in p-type nitride semiconductor decreases in line with concentration of the hydrogen existing in the atmosphere in the temperature range 950° C.–700° C. The lowering of the hole carrier concentration is supposed to have been caused by a p-type dopant contained in the p-type nitride semiconductor, which p-type dopant being inactivated as a result of coupling with hydrogen. The slight lowering occurred also even in the case of 0% hydrogen concentration seems to have been caused by a hydrogen generated from decomposed ammonia, NH$_3$.

Furthermore, relationship between the hole carrier concentration and the cooling time taken for lowering the substrate temperature from approximately 950° C. to approximately 700° C. in the cooling process was also investigated.

Figure 6:
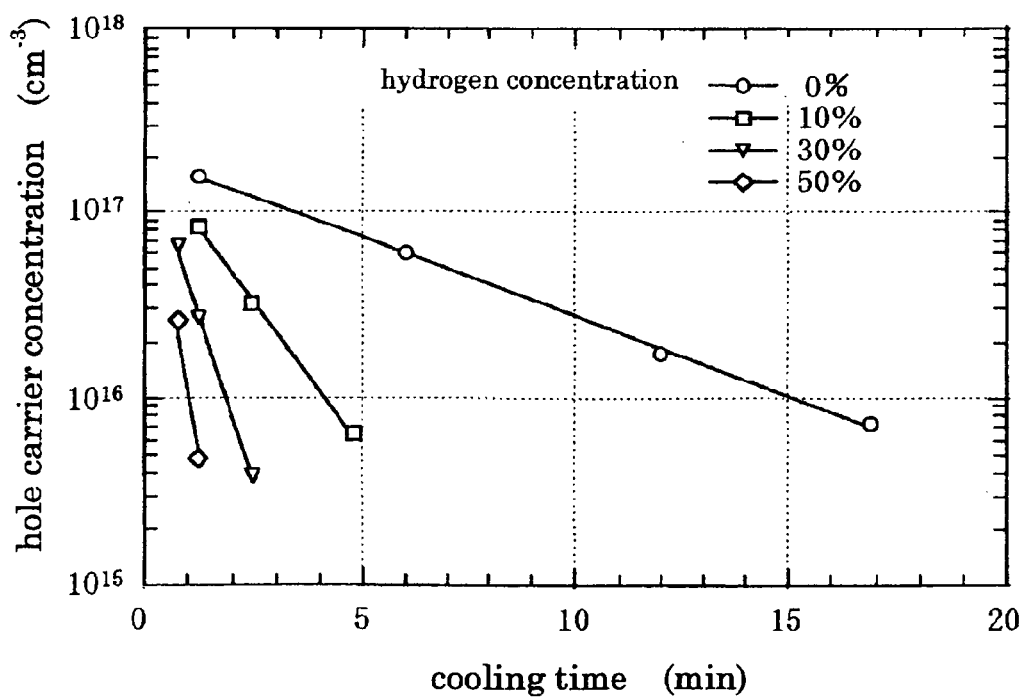
FIG. 6 Graph showing dependence of the hole carrier concentration on the time for cooling the substrate from approximately 950° C. to approximately 700° C., during the cooling process in a method for manufacturing p-type nitride semiconductor in an embodiment of the present invention.

FIG. 6 is a graph showing the dependence of the hole carrier concentration in embodiment 3 on the substrate cooling time taken for lowering from approximately 950° C. to approximately 700° C. in the cooling process. Namely, Mg doped GaN layers formed at substrate temperature 1050° C. were cooled to 700° C. at various cooling rates, and then down to room temperature; the horizontal axis represents the cooling time taken for lowering the substrate temperature from approximately 950° C. to approximately 700° C., while the hole carrier concentration is plotted on the vertical axis. The cooling rate has been controlled to be substantially constant at least in the course of the substrate temperature range from approximately 950° C. to approximately 700° C. The atmosphere for the cooling process was prepared with a 20% concentration of ammonia, NH$_3$, in nitrogen base, in four versions of different hydrogen concentrations, 50%, 30%, 10% and 0%. As seen in FIG. 6, the hole carrier concentration decreased along with the lengthening cooling time with all of the cases of different hydrogen concentrations. Cooling time needed for the hole carrier concentration to become approximately $1 \times 10^{16}$ cm$^{-3}$ at room temperature was calculated from FIG. 6; results were, 1.0 min., 1.8 min., 4.1 min. and 15 min. for the hydrogen concentrations 50%, 30%, 10% and 0%, respectively. Namely, in order to assure the value approximately $1 \times 10^{16}$ cm$^{-3}$ or higher, which is the requirement to be a practically usable p-type semiconductor, it has been found out that the cooling time for lowering the substrate temperature from approximately 950° C. to approximately 700° C. needs to be within 1.0 min., 1.8 min., 4.1 min and 15 min., respectively, for the cases of hydrogen concentrations 50%, 30%, 10% and 0%.

Figure 7:
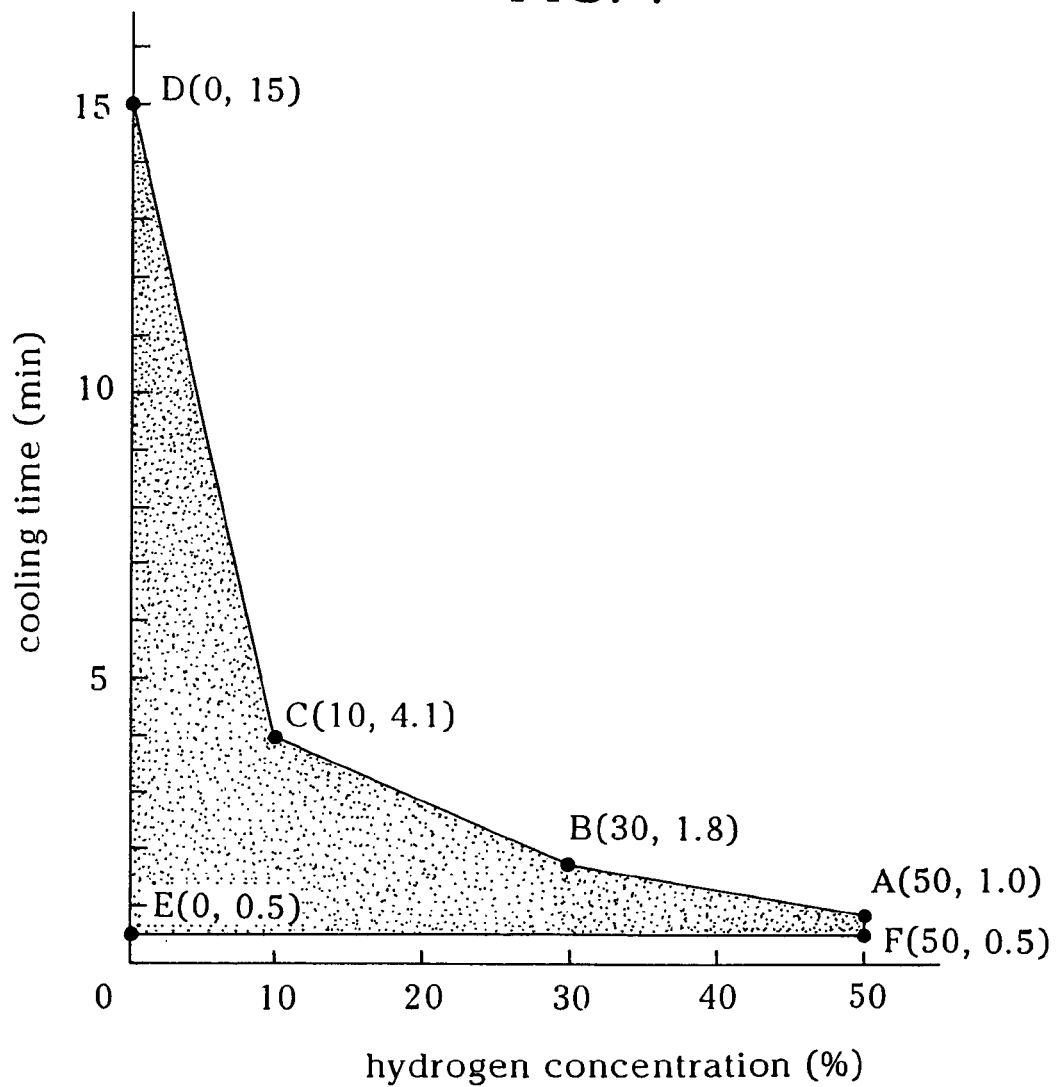
FIG. 7 Graph showing relationship between the hydrogen concentration in the atmosphere and the time for cooling the substrate from approximately 950° C. to approximately 700° C., during the cooling process in a method for manufacturing p-type nitride semiconductor in an embodiment of the present invention.

FIG. 7 is a graph showing the relationship between the hydrogen concentration in the atmosphere and the substrate cooling time taken for lowering from approximately 950° C. to approximately 700° C. in the cooling process in a method for manufacturing p-type nitride semiconductor in accordance with an embodiment of the present invention.

Based on the above results, it can be stated that the combinations of the hydrogen concentration in the atmosphere and the cooling time, under which combinations the inactivation of p-type dopant is difficult to occur during the substrate cooling process from approximately 950° C. to approximately 700° C. that comes after a p-type nitride semiconductor is formed, should fall within a range shown in FIG. 7; in a coordinate (X, Y), X axis representing the hydrogen concentration (%) in atmosphere, while Y axis representing the cooling time (min.) taken for cooling a substrate from approximately 950° C. to approximately 700° C., the range is shown by a region surrounded by points A-B-C-D-E-F, where the point A(50, 1.0), point B(30, 1.8), point C(10, 4.1), point D(0, 5), point E(0, 0.5) and point F(50, 0.5). The reason why the lowest limit of cooling time is specified by a straight line E-F to be 0.5 min. irrelevant to the hydrogen concentration, is that if it is cooled in a cooling time shorter than that the p-type nitride semiconductor is liable to be damaged by cracks caused by thermal shock.

Embodiment 4

Likewise in embodiment 3, a p-type nitride semiconductor having the structure of FIG. 1 is manufactured through a method in accordance with a fourth exemplary embodiment of the present invention.

In the first place, a buffer layer 12 and a p-type nitride semiconductor layer 13 are formed in the order on a substrate 11 as shown in FIG. 1, in the same way as in embodiment 3.

In the method for manufacturing p-type nitride semiconductor in embodiment 4, the p-type nitride semiconductor layer is cooled when the substrate temperature is in the vicinity of approximately 800° C. under a combination of the hydrogen concentration in the atmosphere and the cooling rate, with which the inactivation is hard to occur with the p-type dopant.

As seen in FIG. 5, the inactivation of p-type dopant develops most significantly when the substrate temperature is approximately 800° C. in a range between approximately 950° C. and approximately 700° C. Therefore, in order to maintain the low resistivity property of a p-type nitride semiconductor, it is effective to make the travelling time of the substrate at the vicinity of 800° C. shortest possible. In other words, the cooling rate at approximately 800° C. should be faster than the specified.

From FIG. 6, it is understood that in order to secure the value approximately $1 \times 10^{16}$ cm$^{-3}$ or more, which being a requirement to be a practical p-type semiconductor, the cooling rate at the vicinity of substrate temperature 800° C. needs to be 250° C./min., 140° C./min., 61° C./min. and 17° C./min. or faster, respectively, for the cases of hydrogen concentration 50%, 30%, 10% and 0%.

Figure 8:
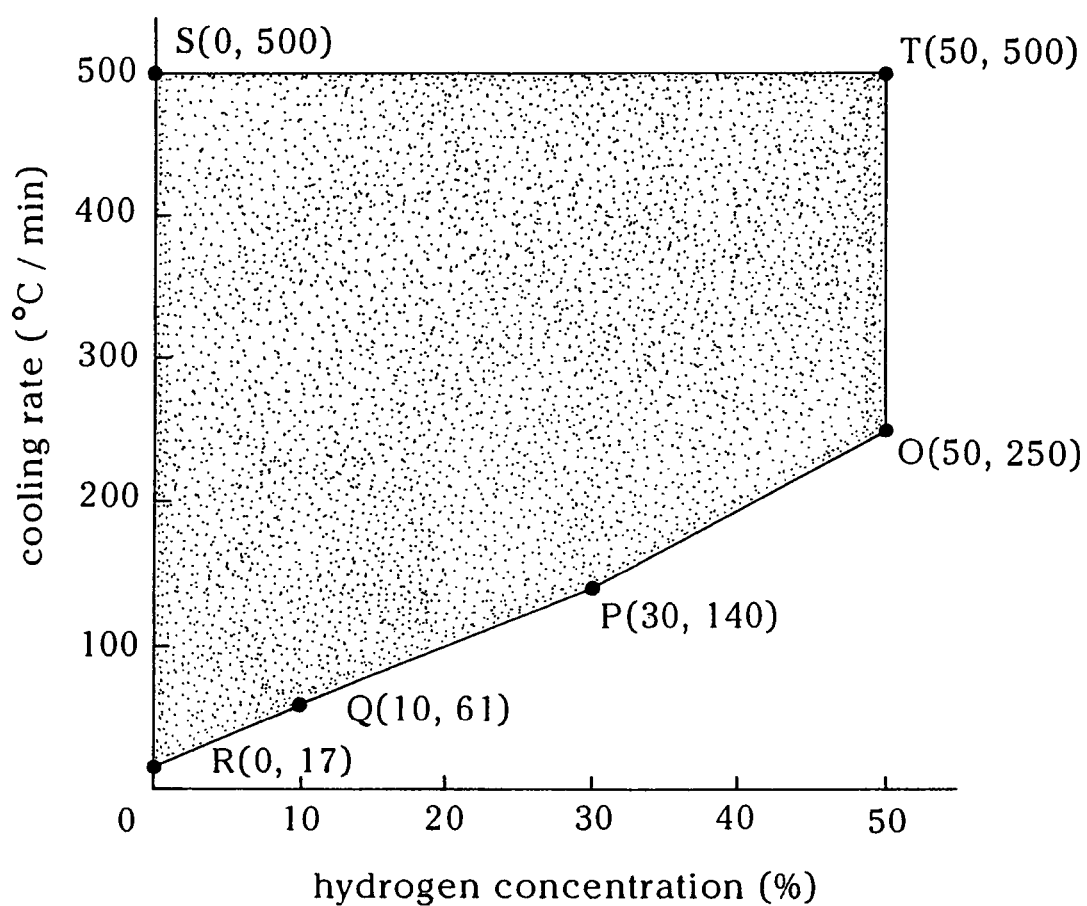
FIG. 8 Graph showing relationship between the hydrogen concentration in the atmosphere and the substrate cooling rate at approximately 800° C., during the cooling process in a method for manufacturing p-type nitride semiconductor in an embodiment of the present invention.

FIG. 8 is a graph showing the relationship between the hydrogen concentration in the atmosphere and the substrate cooling rate at the vicinity of 800° C. during the cooling process, in a method for manufacturing p-type nitride semiconductor in accordance with a fourth exemplary embodiment of the present invention.

Based on the above results, it can be stated that the combinations of the hydrogen concentration in the atmosphere and the cooling rate, under which combinations the inactivation of p-type dopant is difficult to occur at the substrate temperature approximately 800° C. during the substrate cooling process that comes after a p-type nitride semiconductor is formed, should fall within a range shown in FIG. 8; in a coordinate (X, Y), X axis representing the hydrogen concentration (%) in atmosphere, while Y axis representing the representing the cooling rate (° C./min.) at the vicinity of substrate temperature 800° C., the range is shown by a region surrounded by points O-P-Q-R-S-T, where the point O(50, 250), point P(30, 140), point Q(10, 61), point R(0, 17), point S(0, 500) and point T(50, 500). The reason why the upper limit of cooling rate is specified by a straight line S-T to be 500° C./min., irrelevant to the hydrogen concentration, is that if it is cooled at a cooling rate faster than that a p-type nitride semiconductor is liable to be damaged by cracks due to thermal shock.

The substrate 11 may be made of, besides sapphire, different materials other than nitride semiconductor, such as SiC, spinel, Si, GaAs, etc. Also, it can be made with GaN or other nitride semiconductor materials. In a case where the substrate 11 is made of such a different material, a buffer layer 12 of GaN, etc. is formed at a low substrate temperature approximately 400° C.–approximately 600° C., between the substrate 11 and p-type nitride semiconductor layer 13 to be formed thereon, in order to ease the lattice mismatch between the nitride semiconductor and the substrate 11. In a case where the substrate 11 is made of nitride semiconductor, a p-type nitride semiconductor layer 13 may be formed direct on the substrate 11, without providing a buffer layer 12.

The p-type nitride semiconductor layer 13 may be provided on a substrate 11 on which an n-type nitride semiconductor layer and an active layer of nitride semiconductor are formed in advance. Thus a device layer structure having PN junction can be formed.

The p-type nitride semiconductor layer 13 can be formed by introducing the sources of p-type dopant, nitrogen and Group III sources, while keeping the temperature of substrate 11 at approximately 950° C. or higher. Preferred temperature range for the substrate is approximately 950° C.–approximately 1200° C. If the substrate temperature is lower than 950° C., the p-type dopant readily couples with hydrogen during formation of the p-type nitride semiconductor layer 13, making it inactive. This makes formation of a low resistivity p-type nitride semiconductor layer difficult. If the substrate temperature is higher than 1200° C., it becomes difficult to form a p-type nitride semiconductor layer of superior crystal property.

The p-type nitride semiconductor layer 13 may be provided in the form of a single layer of GaN, AlGaN, InGaN, InAlGaN, etc, or by stacking some of these layers. What is preferred of these is $Al_x Ga_{1-x} N$ ($0 \leq x < 1$), which provides a superior crystal property at a substrate temperature approximately 950° C. or higher, or that doped with a very small amount of In.

For the p-type dopant to the p-type nitride semiconductor layer 13, Mg, Zn, Cd, C, etc. may be used. What is preferred of these is Mg, with which the p-type conduction is made available with a relative ease. Concentration of the p-type dopant should preferably be not lower than $1\times10^{19}$ cm$^{-3}$ not higher than $5\times10^{20}$ cm$^{-3}$. If the concentration of p-type dopant is lower than $1\times10^{19}$ cm$^{-3}$, the hole carrier concentration of p-type nitride semiconductor layer 13 becomes low, and ohmic contact resistance becomes high when forming an electrode on the p-type nitride semiconductor layer 13. If it is higher than $5\times10^{20}$ cm$^{-3}$, the crystal property of p-type nitride semiconductor layer 13 deteriorates due to the p-type dopant doped for a high concentration, rendering it difficult to obtain the p-type conduction.

As to the atmosphere in a reaction chamber for forming the p-type nitride semiconductor layer 13, it is preferred that it contains hydrogen of about 5%–70% concentration, more preferably 10%–30% concentration. If the concentration is lower than 5%, the crystal property of p-type nitride semiconductor layer 13 deteriorates due to lowered atomic migration at the formation surface, and the rate of p-type dopant taken in the p-type nitride semiconductor layer 13 decreases. If the concentration goes beyond 70%, the p-type dopant is inactivated by hydrogen during formation of the p-type nitride semiconductor layer 13.

In the cooling process, the ammonia, $NH_3$, concentration in the atmosphere should preferably be maintained to be 5% or higher, at least by the time when the substrate temperature becomes lower than approximately 950° C. If the concentration is lower than 5%, nitrogen readily separates from the surface of the p-type nitride semiconductor, which readily leads to a deteriorated crystal property at the surface.

Also, in the cooling process, the ammonia, $NH_3$, concentration in the atmosphere should preferably be 30% or lower during the time when the substrate temperature is approximately 950° C.–approximately 700° C. If it is higher than 30%, the hole carrier concentration in the p-type nitride semiconductor easily decrease because of increased hydrogen generated as a result of thermal decomposition of ammonia, $NH_3$.

CONCRETE EXAMPLE

Now in the following, method for manufacturing p-type nitride semiconductor of the present invention is described on concrete examples, referring to the drawings.

Concrete Example 1

A p-type nitride semiconductor was manufactured, the cross sectional structure of which is as shown in FIG. 1.

In the first place, a substrate 11 having a mirror-finished main surface was placed in a reaction chamber (not shown) and held by a substrate holder, and then temperature of the substrate 11 is raised to approximately 1000° C., and nitrogen gas was introduced at 5 L/min., hydrogen gas at 5 L/min. while the substrate 11 was heated for approximately 10 min. Stains of organic substance and humidity sticking on the surface of substrate 11 were thus removed.

The substrate temperature was lowered to approximately 550° C., and then nitrogen gas was introduced as carrier gas at a flow rate of approximately 16 L/min., and ammonia, $NH_3$, at a flow rate of approximately 4 L/min., TMG at a flow rate of approximately 40 µmol/min. to form a buffer layer 12 of GaN for a thickness of approximately 0.03 µm on the surface of substrate 11.

The TMG supply to reaction chamber was once suspended and the substrate temperature was raised to approximately 1050° C., and a 2 µm thick p-type nitride semiconductor layer 13 of GaN doped with Mg, p-type dopant, was grown on the buffer layer 12, by introducing nitrogen gas at a flow rate of approximately 12 L/min., hydrogen gas at a flow rate of approximately 4 L/min. as the carrier gas, and ammonia, $NH_3$, at a flow rate of approximately 4 L/min., TMG at a flow rate of approximately 80 µmol/min. and $Cp_2Mg$ at a flow rate of approximately 0. 2 µmol/min. Mg concentration in the p-type nitride semiconductor was approximately $2\times10^{19}$ cm$^{-3}$. The flow rate of hydrogen gas includes the hydrogen gas needed for vaporizing the TMG and the $Cp_2Mg$.

The supply of TMG and $Cp_2Mg$ to the reaction chamber was suspended, and then the substrate 11 was cooled from 1050° C. to 950° C. in approximately 0. 5 min., while introducing nitrogen gas at a flow rate of approximately 12 L/min., hydrogen gas at a flow rate of approximately 4 L/min. and ammonia, $NH_3$, at a flow rate of approximately 4 L/min. as the ambient gas.

And then, hydrogen gas was suspended, and nitrogen gas was supplied at a flow rate of approximately 16 L/min., ammonia, $NH_3$, at a flow rate of approximately 4 L/min. as the ambient gas, while temperature of substrate 11 was lowered from 950° C. to 700° C. in approximately 1. 2 min. The rate of cooling the substrate 11 at the vicinity of 800° C. was approximately 210° C./min. After that, the ammonia, $NH_3$, supply was suspended, and nitrogen gas was kept on flowing as the ambient gas at a flow rate of approximately 20 L/min. until the substrate temperature becomes lower than 100° C.

After the cooling was finished, the substrate 11 provided with p-type nitride semiconductor layer 13 was taken out of the reaction chamber. The substrate 11 was separated into individual chips of 5 mm square without undergoing post annealing. The chip was measured in the hall effect by the Van der Pauw method; the result showed that the hole carrier concentration was $1.6\times10^{17}$ cm$^{-3}$, and there was a superior p-type semiconductor layer of low resistivity. The hole carrier concentration of the p-type nitride semiconductor layer 13 before cooling was estimated to be approximately $2.0\times10^{17}$ cm$^{-3}$ as the result of extrapolating the zero cooling time in FIG. 6. Accordingly, the decrease of the hole carrier concentration was suppressed within approximately 20% during the cooling process.

Concrete Example 2

A p-type nitride semiconductor of the present example 2 was manufactured in the same procedure as in example 1, except that the conditions of atmosphere during cooling process were modified.

Practically described, after the p-type nitride semiconductor layer 13 was formed, the supply of TMG and $Cp_2Mg$ to the reaction chamber was suspended, and then the substrate 11 was cooled from 1050° C. to 700° C. in approximately 1. 7 min., while supplying nitrogen gas at a flow rate of approximately 12 L/min., hydrogen gas at a flow rate of approximately 4 L/min. and ammonia, $NH_3$, at a flow rate of approximately 4 L/min. as the ambient gas. It took approximately 0. 5 min. for the temperature of substrate 11 to come down from 1050° C. to 950° C., approximately 1. 2 min. from 950° C. to 700° C. The rate of cooling the substrate 11 at the vicinity of 800° C. was approximately 210° C./min.

After the temperature of substrate 11 became lower than 700° C., supply of the hydrogen gas and ammonia, $NH_3$, was suspended, and nitrogen gas was kept on flowing as the ambient gas at a flow rate of approximately 20 L/min. until the substrate temperature becomes lower than 100° C.

After the cooling was finished, the substrate 11 provided with p-type nitride semiconductor layer 13 was taken out of the reaction chamber. The substrate 11 was separated into individual chips of 5 mm square. The chip was measured in the hall effect. Result of the measurement showed that the hole carrier concentration was approximately $4.6 \times 10^{16}$ $cm^{-3}$. The hole carrier concentration of the p-type nitride semiconductor layer 13 before cooling is assumed to be approximately $2.0 \times 10^{17}$ $cm^{-3}$. Accordingly, the decrease of positive hole carrier concentration during the cooling process was suppressed within approximately 77%.

Comparative Example 1

A p-type nitride semiconductor of the present comparative example 1 was manufactured in the same procedure as in the concrete example 2, except that the cooling time (or cooling rate) during cooling process were modified.

Practically described, after the p-type nitride semiconductor layer 13 was formed, the supply of TMG and $Cp_2Mg$ to the reaction chamber was suspended, and then the substrate 11 was cooled from 1050° C. to 700° C. in approximately 5. 6 min., while supplying nitrogen gas at a flow rate of approximately 12 L/min., hydrogen gas at a flow rate of approximately 4 L/min. and ammonia, $NH_3$, at a flow rate of approximately 4 L/min. as ambient gas. It took approximately 1. 6 min. for the temperature of substrate 11 to come down from 1050° C. to 950° C., approximately 4. 0 min. from 950° C. to 700° C. The rate of cooling the substrate 11 at the vicinity of 800° C. was approximately 63° C./min.

After the temperature of substrate 11 became lower than 700° C., supply of the hydrogen gas and ammonia, $NH_3$, was suspended, and nitrogen gas was kept on flowing as the ambient gas at a flow rate of approximately 20 L/min. until the substrate temperature becomes lower than 100° C.

After the cooling was finished, the substrate 11 provided with p-type nitride semiconductor layer 13 was taken out of the reaction chamber. The substrate 11 was separated into individual chips of 5 mm square. The chip was measured in the hall effect. Result of the measurement showed that the hole carrier concentration was approximately $2 \times 10^{15}$ $cm^{-3}$, a high resistivity.

The hole carrier concentration of the p-type nitride semiconductor layer 13 before cooling is assumed to be approximately $2.0 \times 10^{17}$ $cm^{-3}$. Accordingly, the hole carrier concentration decreased by approximately 99% during the cooling process.

Concrete Example 3

Figure 9:
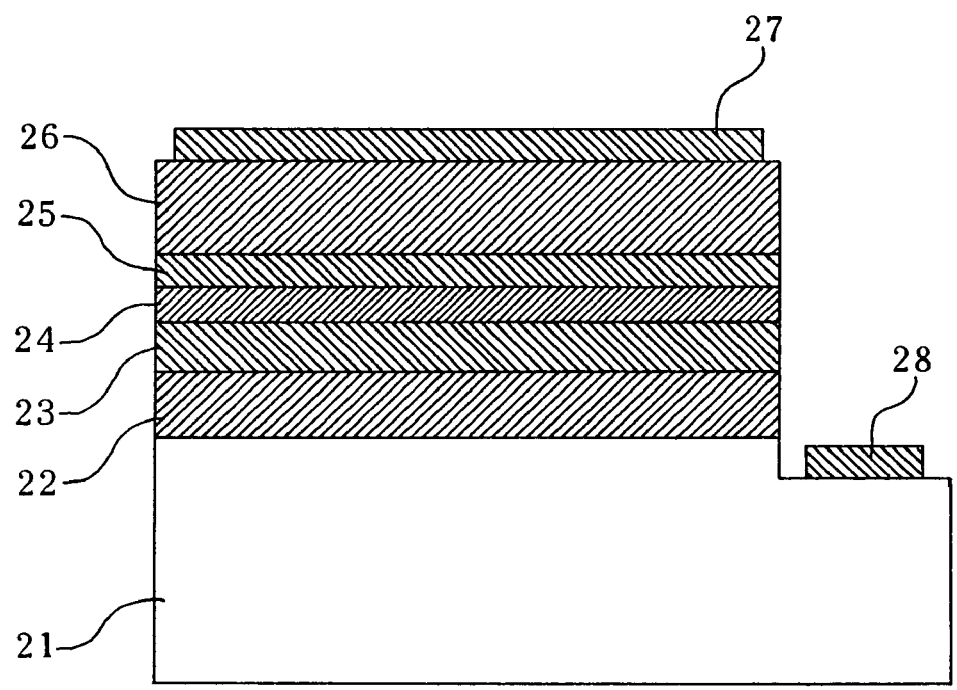
FIG. 9 Cross sectional view showing the structure of a p-type nitride semiconductor in other embodiment of the present invention.

FIG. 9 is a cross sectional view showing the structure of p-type nitride semiconductor in accordance with other exemplary embodiment of the present invention.

In the present concrete example, a nitride semiconductor light emitting device of FIG. 9 was manufactured, in which a p-type nitride semiconductor layer was disposed at the uppermost.

The nitride semiconductor light emitting device comprises a first n-type clad layer 22 of non-doped GaN, a second n-type clad layer 23 of non-doped AlGaN, a light-emitting layer 24 of non-doped InGaN, an intermediary layer 25 of non-doped GaN and a p-type clad layer 26 of Mg-doped AlGaN stacked in the order on a substrate 21 of Si-doped n-type GaN. On the p-type clad layer 26 is a p side electrode 27 formed of Pt and Au stacked in the order, while an n side electrode 28 is formed of Ti and Au which is disposed on the exposed region of the substrate 21. Thus the present light emitting device is a light emitting diode forming a PN junction with the light-emitting layer 24 in between.

Method for manufacturing the light emitting diode of the above configuration is described in the following.

In the first place, a substrate 21, which is made of GaN, doped with Si to provide an n-type property and having a mirror-finished surface, was placed in a reaction chamber (not shown) and held by a substrate holder. Temperature of the substrate 21 was raised to approximately 1100° C., and the substrate 21 was heated for approximately 1 min., while supplying nitrogen gas at a flow rate of 4 L/min., hydrogen gas at a flow rate of 4 L/min. and ammonia, $NH_3$, at a flow rate of 2 L/min. on the substrate 21. Stains of organic substance and humidity sticking on the surface were thus removed.

The substrate temperature was maintained at approximately 1100° C., and nitrogen gas was introduced at a flow rate of approximately 13 L/min., hydrogen gas at a flow rate of approximately 3 L/min. as carrier gas, and ammonia, $NH_3$, at a flow rate of approximately 4 L/min., TMG at a flow rate of approximately 80 μmol/min. to form the first n-type clad layer 22 of non-doped GaN for a thickness of 0.5 μm.

After the first n-type clad layer 22 was formed, temperature of the substrate 21 was maintained at approximately 1050° C., and nitrogen gas was introduced at a flow rate of approximately 15 L/min., hydrogen gas at a flow rate of approximately 3 L/min. as carrier gas, and ammonia, $NH_3$, at a flow rate of approximately 2 L/min., TMG at a flow rate of approximately 40 μmol/min. and trimethylaluminum (TMA) at a flow rate of approximately 3 μmol/min. to form a 0.05 μm thick second n-type clad layer 23 of non-doped $Al_{0.05}Ga_{0.95}N$.

After the second n-type clad layer 23 was formed, supply of the TMG and TMA was suspended, temperature of substrate 21 was lowered to approximately 700° C., and maintained at this level. As the carrier gas, nitrogen gas was supplied at a flow rate of approximately 14 L/min., ammonia, $NH_3$, at a flow rate of approximately 6 L/min., TMG at a flow rate of approximately 4 μmol/min. and trimethylindium (TMI) at a flow rate of approximately 1 μmol/min. to form an SQW light-emitting layer 24 of non-doped $In_{0.15}Ga_{0.85}N$ for a thickness of 0. 002 μm.

After the light-emitting layer 24 was grown, supply of the TMI was suspended, and nitrogen gas was kept on flowing as carrier gas at a flow rate of approximately 14 L/min., and ammonia, $NH_3$, at a flow rate of 6 L/min., TMG at a flow rate of 2 μmol/min. on the substrate 21 raising the substrate temperature towards 1050° C. In this way, the intermediary layer 25 of non-doped GaN was formed for a thickness of 0. 004 μm.

After the substrate 21 temperature reached at 1050° C., nitrogen gas was supplied at a flow rate of approximately 14 L/min., hydrogen gas at a flow rate of approximately 4 L/min. as carrier gas, and ammonia, $NH_3$, at a flow rate of 2 L/min., TMG at a flow rate of 40 μmol/min., TMA at a flow rate of 3 μmol/min. and $Cp_2$ Mg at a flow rate of 0.4 μmol/min. to grow a p-type clad layer 26 of Mg-doped $Al_{0.05}Ga_{0.95}N$ for a thickness of 0.2 μm. Mg concentration in the p-type clad layer 26 was approximately $8 \times 10^{19}$ $cm^{-3}$.

After the p-type clad layer 26 was grown, supply of the TMG, TMA and Cp$_2$Mg was suspended, and temperature of the substrate 21 was lowered from 1050° C. to 950° C. in approximately 0. 5 min. while introducing nitrogen gas at a flow rate of approximately 14 L/min., hydrogen gas at a flow rate of approximately 4 L/min. and ammonia, NH$_3$, at a flow rate of approximately 2 L/min. as the ambient gas.

Supply of the hydrogen gas was suspended, and then temperature of the substrate 21 was lowered from 950° C. to 700° C. in approximately 1. 2 min., while supplying nitrogen gas at a flow rate of approximately 18 L/min., ammonia, NH$_3$, at a flow rate of approximately 2 L/min. as the ambient gas. The rate of cooling the substrate 21 at the vicinity of 800° C. was approximately 210° C./min.

After the temperature of substrate 21 became lower than 700° C., supply of the ammonia, NH$_3$, was suspended, while nitrogen gas was kept on flowing as the ambient gas at a flow rate of approximately 20 L/min. until the substrate 21 temperature became lower than 100° C. Then the substrate 21 was taken out of the reaction chamber.

The nitride semiconductor layers thus provided, the p-type clad layer 26, among others, proved themselves to be superior p-type semiconductor layers of low resistivity, without undergoing the post annealing process for activating the doped Mg.

Next, over the surface of nitride semiconductor having a stacked-layer structure thus formed, a SiO$_2$ layer was deposited through a CVD process, without applying any post annealing. A rectangular patterning was provided thereon through photolithography and wet etching process, and a SiO$_2$ etching mask was formed. By using a reactive ion etching process, the p-type clad layer 26, the intermediary layer 25, the light-emitting layer 24, the second n-if type clad layer 23, the first n-type clad layer 22 and a part of the substrate 21 were removed in a direction reverse to the stacking direction of layers, until the substrate 21 was etched off for a depth of approximately 1 μm. Thus the surface of substrate 21 was exposed in part. On a part of the exposed surface of substrate 21, an n side electrode 28 was formed by stacking a 0.1 μm thick Ti and a 0. 5 μm thick Au, through photolithography and evaporation process. After removing the SiO$_2$ etching mask by wet etching process, a p side electrode 27 formed of a 0. 3 μm thick Pt and a 0. 5 μm thick Au was provided covering most part of the surface of the p-type clad layer 26 by using photolithography and evaporation process. The substrate 21 was adjusted in the thickness to a 100 μm thick by back grinding, and then separated into individual chips by scribing.

A nitride semiconductor light-emitting device was thus provided in the structure as illustrated in FIG. 9.

The light-emitting device was mounted, with the chip having the electrodes down, on a Si diode on which a couple of positive and negative electrodes are provided. They are connected to each other with an Au bump. The light-emitting device was mounted so that the p side electrode 27 and the n side electrode 28, respectively, are connected with the negative electrode and the positive electrode of the Si diode. The Si diode bearing the light-emitting device was mounted and fixed on a stem using an Ag paste, the positive electrode of Si diode was connected to an electrode on the stem with a wire, and then molded with resin to complete a finished light emitting diode. The light emitting diode, was driven by a 20 mA forward current, and it emitted blue light of 470 nm peak wavelength exhibiting an even light emission from the reverse surface of substrate 21. The light output was 4 mW, forward operation voltage was 3.4 V.

As described in the above, in the present concrete example, a p-type semiconductor layer of low resistivity and superior quality is formed as the p-type clad layer 26 in the p-type nitride semiconductor layer forming process; and in the cooling process, it can be cooled while preserving the low resistivity property of the p-type clad layer 26. As a result, a nitride semiconductor light-emitting device operating on a low voltage and yielding a high output is made available without needing any post annealing treatment or other such specific processing.

In a method for manufacturing p-type nitride semiconductor of the present invention, a low resistivity p-type nitride semiconductor layer is formed on a substrate in an atmosphere containing hydrogen for a certain specific degree at which the inactivation of p-type dopant can be well suppressed; and the p-type nitride semiconductor layer thus formed is cooled in a certain specific cooling time, or atmosphere, so that the hole carrier concentration of the p-type nitride semiconductor layer decreases in a manner where the low resistivity property is reasonably preserved. As a result, a p-type nitride semiconductor of superior crystal property is made available without needing any post annealing treatment.

In a method for manufacturing p-type nitride semiconductor of the present invention, a low resistivity p-type nitride semiconductor layer is formed on a substrate, and the p-type nitride semiconductor layer is cooled, during a certain specific substrate temperature range in the cooling process, under certain specific combination of the hydrogen concentration in the atmosphere and the cooling time, or the hydrogen concentration in the atmosphere and the cooling rate, under which specific combination it is hard for the p-type dopant to become inactivated. As a result, a p-type nitride semiconductor of low resistivity and superior crystal quality is made available without needing any post annealing treatment or other such specific processing.

Furthermore, in the method of present invention, the manufacturing process of p-type nitride semiconductor can be simplified, so the cost of manufacturing a nitride semiconductor device incorporating a p-type nitride semiconductor can be reduced.

What is claimed is:

1. A method for manufacturing a semiconductor, comprising:
   a growing process for growing a p-type nitride semiconductor layer over a substrate in an atmosphere containing at least a p-type dopant and hydrogen; and
   a cooling process for cooling the substrate in an atmosphere containing at least hydrogen greater than 0% and less than or equal to 50% in capacity percent, said cooling process being performed with a combination of hydrogen concentration in the atmosphere and cooling time such that the resulting p-type nitride semiconductor layer has a hole carrier concentration of approximately 1×10$^{16}$ cm$^{-3}$ or higher at room temperature.

2. The method according to claim 1, wherein the temperature of the substrate is reduced to approximately 600° C. within 25 minutes.

3. The method according to claim 1, wherein the temperature of the substrate is reduced to approximately 600° C. within 20 minutes.

4. The method according to claim 1, wherein the temperature of the substrate is reduced to approximately 600° C. within 15 minutes.

5. The method according to claim 1, wherein the temperature of the substrate is reduced to approximately 600° C. within 10 minutes.

6. The method according to claim 1, wherein the temperature of the substrate is reduced to approximately 600° C. within 5 minutes.

7. The method according to claim 1, wherein the hole carrier concentration of said p-type nitride semiconductor layer decreases during said cooling process.

8. The method according to claim 7, wherein the decrease of said hole carrier concentration is greater than 0% and less than or equal to 95%.

9. The method according to claim 1, wherein the atmosphere in said growing process contains hydrogen for 5%–70% in capacity percent.

10. The method according to claim 1, wherein during said cooling process, the substrate is in an atmosphere containing ammonia.

11. A method for manufacturing a semiconductor, comprising:
    a growing process for growing a p-type nitride semiconductor layer over a substrate in an atmosphere containing at least a p-type dopant and hydrogen; and
    a cooling process for cooling the substrate from approximately 950° C. to approximately 700° C. in an atmosphere containing at least hydrogen, said cooling process being performed with a combination of hydrogen concentration in the atmosphere and cooling time such that the resulting p-type nitride semiconductor layer has a hole carrier concentration of approximately $1\times10^{16}$ cm$^{-3}$ or higher at room temperature.

12. The method according to claim 11, wherein the combination of said hydrogen concentration in atmosphere and said cooling time falls within a region specified by points A-B-C-D-E-F, in an X-Y coordinate, X axis representing said hydrogen concentration (%) in atmosphere, Y axis representing said cooling time (min.); where, the point A(50, 1.0), point B(30, 1.8), point C(10, 4.1), point D(0, 15), point E(0, 0.5) and point F(50, 0.5).

13. A method for manufacturing a semiconductor, comprising:
    a growing process for growing a p-type nitride semiconductor layer over a substrate in an atmosphere containing at least a p-type dopant and hydrogen; and
    a cooling process for cooling the substrate in an atmosphere containing at least hydrogen, said cooling process being performed at the vicinity of approximately 800° C. with a combination of hydrogen concentration in the atmosphere and cooling rate such that the resulting p-type nitride semiconductor layer has a hole carrier concentration of approximately $1\times10^{16}$ cm$^{-3}$ or higher at room temperature.

14. The method according to claim 13, wherein the combination of said hydrogen concentration in atmosphere and said cooling rate falls within a region specified by points O-P-Q-R-S-T, in an X-Y coordinate, X axis representing said hydrogen concentration (%) in atmosphere, Y axis representing said cooling rate (° C. min.); where, the point O(50, 250), point P(30, 140), point Q(10, 61), point R(0, 17), point S(0, 500) and point T(50, 500).

15. The method according to claim 1, wherein the temperature of the substrate is reduced to approximately 600° C. within 30 minutes.

16. The method for manufacturing a semiconductor 1, wherein the cooling time for cooling the substrate from 950° C. to approximately 600° C. is controlled.

* * * * *